(12) United States Patent
Chu et al.

(10) Patent No.: US 9,309,109 B2
(45) Date of Patent: Apr. 12, 2016

(54) MEMS-CMOS INTEGRATED DEVICES, AND METHODS OF INTEGRATION AT WAFER LEVEL

(71) Applicant: Taiwan Semiconductor Manufacturing Co., Ltd., Hsin-Chu (TW)

(72) Inventors: Chia-Hua Chu, Zhubei (TW); Chun-Wen Cheng, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 34 days.

(21) Appl. No.: 13/936,380

(22) Filed: Jul. 8, 2013

(65) Prior Publication Data

US 2015/0008540 A1 Jan. 8, 2015

(51) Int. Cl.
*B81C 1/00* (2006.01)

(52) U.S. Cl.
CPC ........... *B81C 1/00238* (2013.01); *B81C 1/0023* (2013.01); *B81C 1/00222* (2013.01); *B81C 1/00261* (2013.01); *B81C 1/00301* (2013.01); *B81B 2201/0257* (2013.01); *B81C 2203/0792* (2013.01)

(58) Field of Classification Search
CPC .............. B81C 1/0023; B81C 1/00238; B81C 1/00301; B81C 1/00261; B81C 1/00222; B81C 2203/0792; B81B 2201/0257

USPC ....................................................... 438/50–53
See application file for complete search history.

(56) References Cited

U.S. PATENT DOCUMENTS

| | | | |
|---|---|---|---|
| 8,368,153 B2 | 2/2013 | Huang et al. | |
| 2009/0166772 A1* | 7/2009 | Hsieh et al. | 257/415 |
| 2010/0133640 A1* | 6/2010 | Wang et al. | 257/459 |
| 2010/0273286 A1* | 10/2010 | Liang et al. | 438/50 |
| 2010/0330722 A1* | 12/2010 | Hsieh et al. | 438/53 |
| 2011/0104844 A1* | 5/2011 | Hsieh et al. | 438/50 |
| 2012/0223613 A1 | 9/2012 | Hung et al. | |
| 2014/0239353 A1* | 8/2014 | Daneman et al. | 257/254 |

* cited by examiner

*Primary Examiner* — John P Dulka
(74) *Attorney, Agent, or Firm* — Duane Morris LLP

(57) ABSTRACT

A method for forming an integrated semiconductor device includes providing a first wafer, providing a second wafer, and bonding the first wafer over the second wafer. The first wafer includes a first substrate having a microelectromechanical system (MEMS) device layer. The second wafer includes a second substrate having at least one active device, and at least one interconnect layer over the second substrate. The MEMS device layer is connected with the at least one interconnect layer. The method further includes forming at least one conductive plug through the first substrate and the MEMS device layer and inside the at least one interconnect layer, etching the second substrate and the at least one interconnect layer to form a cavity extending from a surface of the second substrate to the MEMS device layer, and etching the first substrate and the MEMS device layer to form a MEMS device interfacing with the cavity.

16 Claims, 22 Drawing Sheets

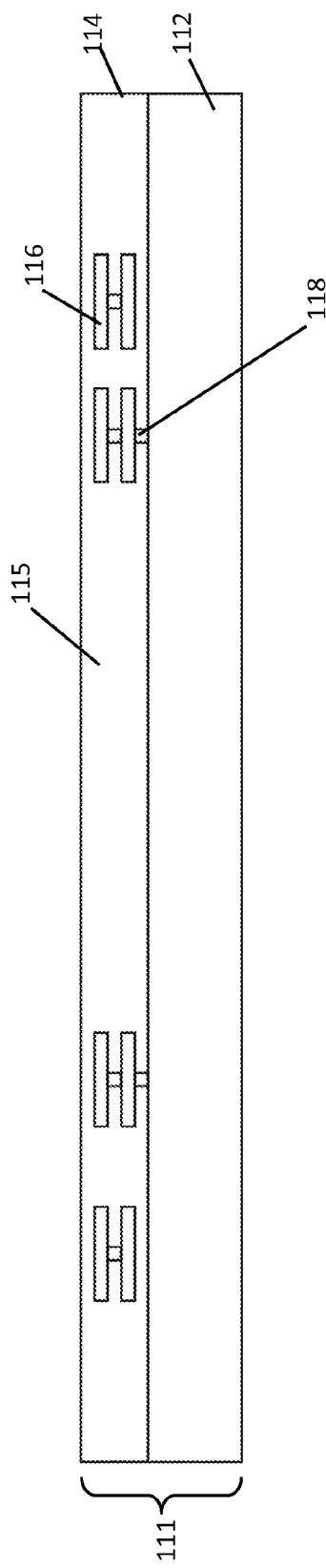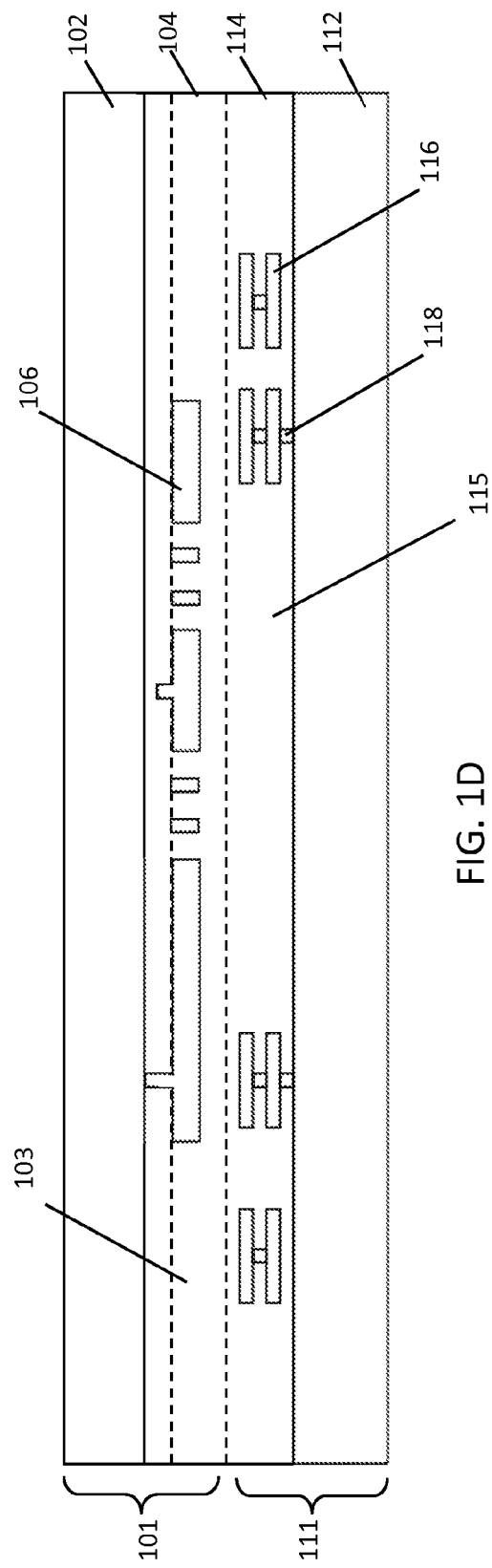

MEMS-CMOS INTEGRATED DEVICES, AND METHODS OF INTEGRATION AT WAFER LEVEL

FIELD

The disclosure relates to semiconductor structures generally, and more particularly relates to semiconductor devices including microelectromechanical systems (MEMS) and active devices, and the method of making the same.

BACKGROUND

Microelectromechanical systems (MEMS) devices are micro-sized devices or machines having stationary and/or movable elements that provide some types of electro-mechanical functionality. MEMS devices may fall in a range from less than 1 micron to several millimeters in size. MEMS devices may be constructed on a silicon substrate or wafer by using various fabrication techniques such as bulk micromachining of the silicon substrate itself and/or surface micromachining. The surface micromachining may involve building microstructures on a substrate using various semiconductor integrated circuit (IC) fabrication technologies such as material deposition, patterned photolithography, and etching.

MEMS devices can be incorporated into IC devices, such as complementary metal-oxide-semiconductor (CMOS) devices. CMOS-MEMS integration can improve device performance, allows for smaller packaging, and reduces manufacturing costs. The CMOS-MEMS integration is generally performed at chip level. In some instances, the CMOS chip may be an application-specific integrated circuit (ASIC) chip which is generally classified as a chip (IC) that is custom built for a specific end use or purpose. One type of ASIC chip is a system-on-chip (SoC) which includes a processor, memory devices, and other ancillary components, built on an application specific chip. Some MEMS devices which may be found in a semiconductor chip package include, for example without limitation, micro-timing devices, micro-sensors, micro-actuators, accelerometers, micro-switches, micro-pumps and valves, and others that support and assist with controlling the functionality of the chip(s) in the package and/or system-level IC.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like reference numerals denote like features throughout specification and drawings.

FIGS. 1A-1K are cross-sectional views of a portion of a semiconductor device during fabrication, illustrating a method for forming an integrated semiconductor device comprising fusion-bonding a first wafer for MEMS and a second wafer for CMOS, in accordance with some embodiments.

FIGS. 2A-2K are cross-sectional views of a portion of a semiconductor device during fabrication, illustrating a method for forming an integrated semiconductor device comprising eutectically bonding a first wafer for MEMS and a second wafer for CMOS, in accordance with some embodiments.

DETAILED DESCRIPTION

Figure 1A:
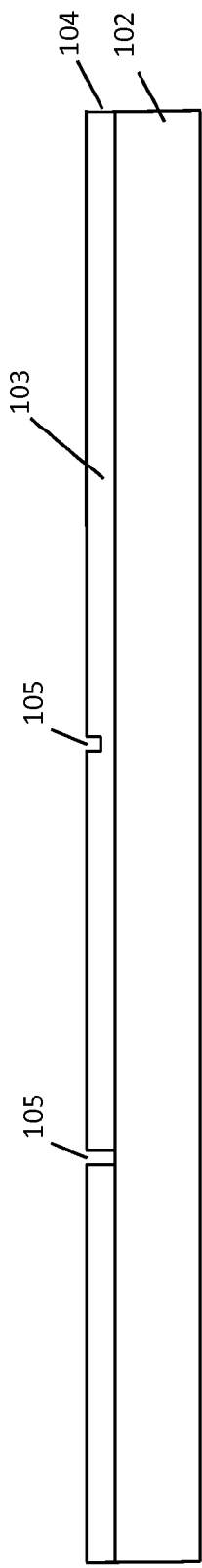

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Active device—MEMS integration (such as, CMOS-MEMS integration, for example) has become increasingly important. If a MEMS structure is built on a CMOS substrate, the integration is limited by the maximum temperature of the metal components in the CMOS substrate. The maximum temperature is generally less than 450° C. The CMOS-MEMS integration is achieved at a chip level. For example, a MEMS microphone product can be integrated to a CMOS IC circuit by wire bonding. However, the CMOS-MEMS integration at chip levels can result in undesired high parasitic capacitance.

Some embodiments provide methods for forming an integrated semiconductor device, particularly methods for integrating active device (e.g., CMOS) and MEMS device structures at wafer level. The methods for integrating CMOS and MEMS structures comprise bonding a first wafer for MEMS and a second wafer for CMOS in accordance with some embodiments. Components for the MEMS structures comprising high temperature resistant semiconductor materials such as polysilicon and single crystal silicon are fabricated before the bonding process. The subsequent integration is not limited by a processing temperature. Such methods of integration provide CMOS-MEMS integrated devices with low or no parasitic capacitance. The MEMS structures are not limited to any type of MEMS.

Although examples are provided below in which the active-device wafer contains CMOS devices, the method described herein can be used to integrate other active device wafers (e.g., wafers containing bipolar or bi-CMOS devices) with MEMS wafers.

For brevity, unless expressly indicated otherwise, references to MEMS made below will be understood to encompass a MEMS device of any type. Examples of a MEMS device include but are not limited to a motion sensor (for example, a gyroscope or an accelerometer), a RF MEMS device (for example, an RF switch, resonator, or filter), an optical MEMS device (for example, a MEMS micro-mirror), a MEMS oscillator, a MEMS microphone, and/or any other MEMS type device, including future MEMS type devices. One of ordinary skill in the art will recognize that the MEMS device could alternatively include nanoelectromechanical elements, for example, the MEMS device could alternatively be a nanoelectromechanical systems (NEMS) device. Examples of a suitable CMOS-MEMS integrated device include but are not limited to a device comprising a MEMS microphone integrated with a CMOS wafer, which is described in this disclosure for illustration purpose, and is not limiting. An integrated device will be also understood to encompass a MEMS device structure integrated with a wafer comprising bipolar or bi-CMOS device structures besides CMOS device structures.

Figure 3:
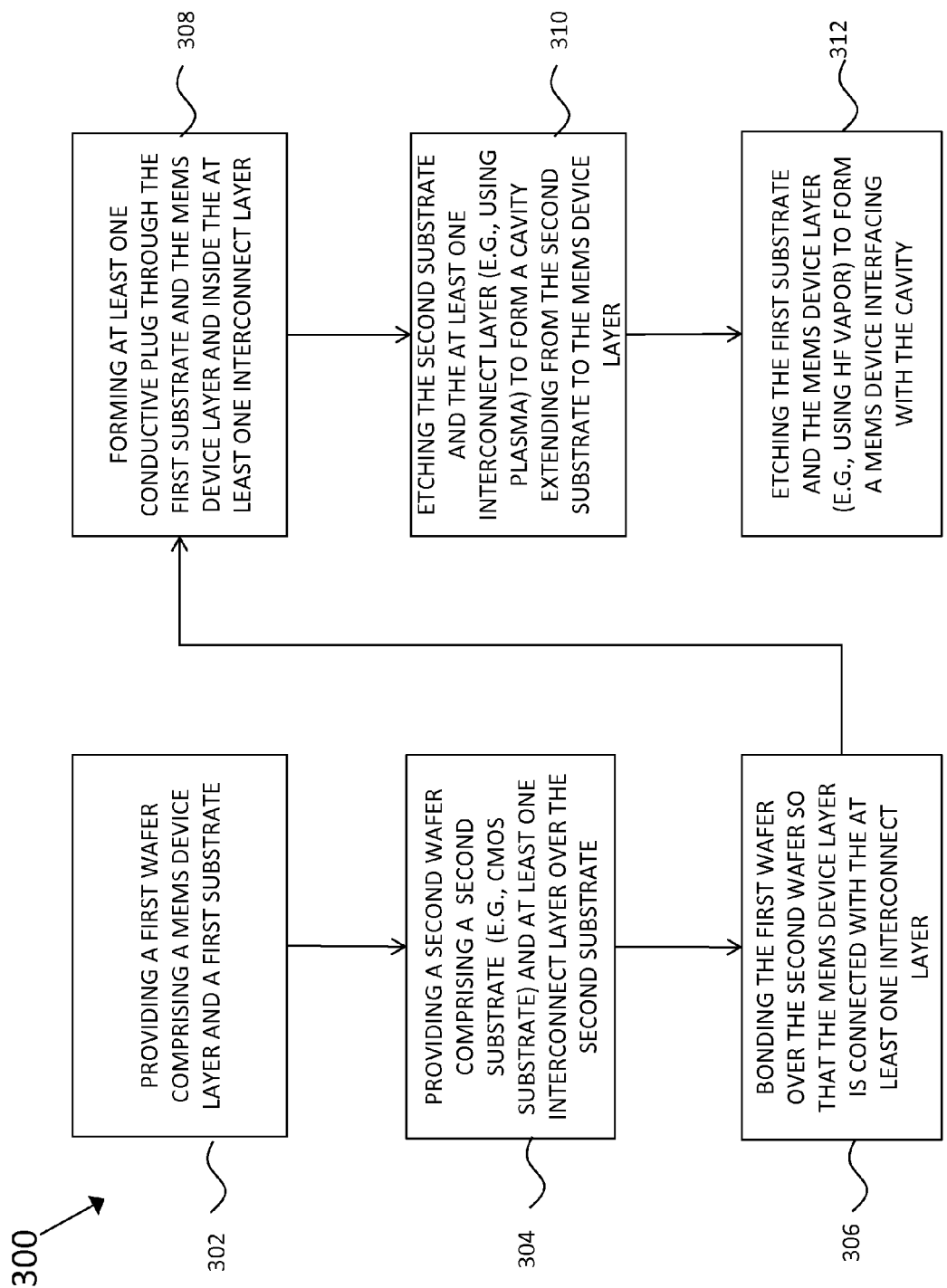
FIG. 3 is a flow chart illustrating an exemplary method for forming an integrated semiconductor device comprising bonding a first wafer for MEMS and a second wafer for CMOS, in accordance with some embodiments.
Figure 4:
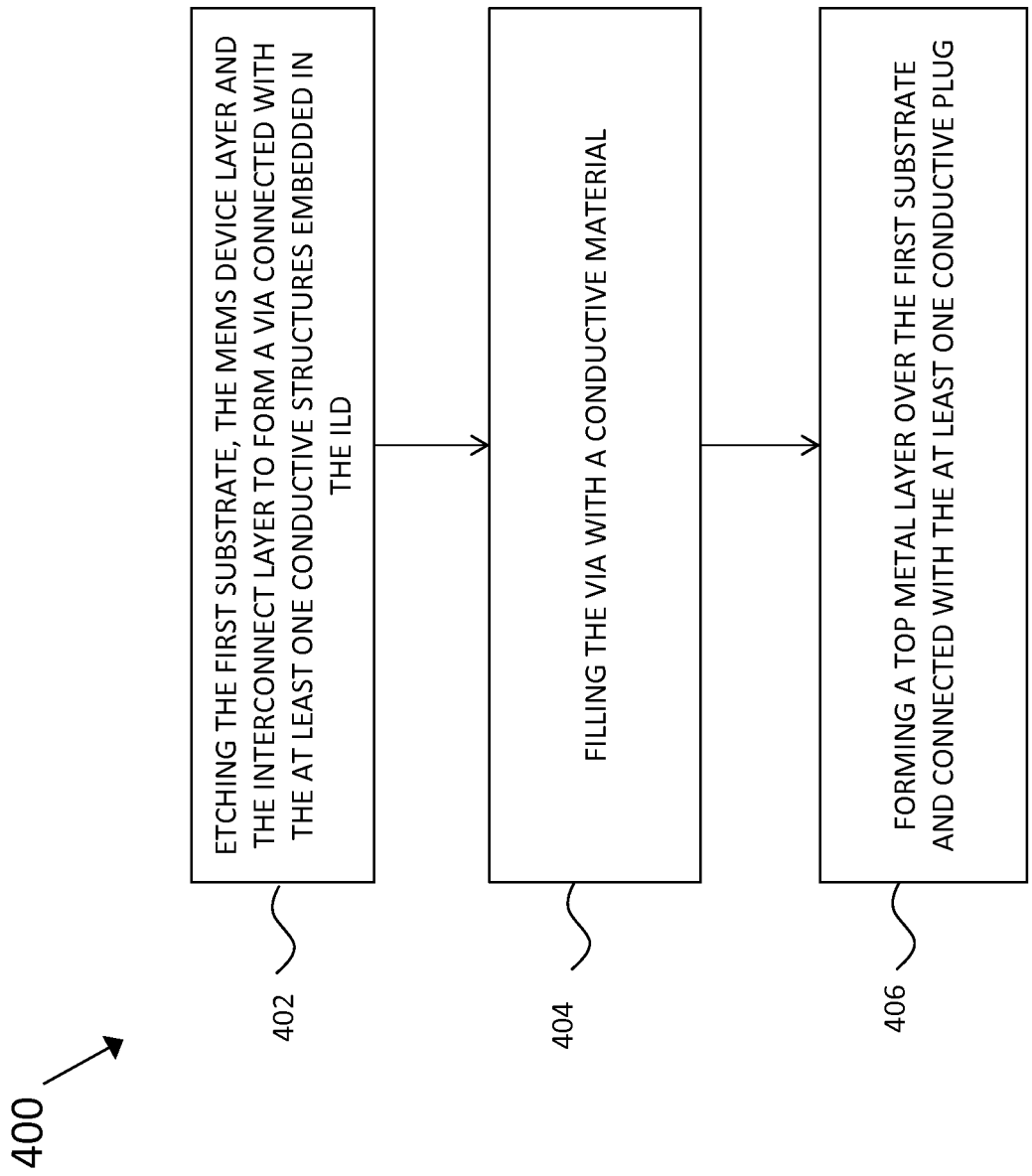
FIG. 4 is a flow chart illustrating a process comprising forming at least one conductive plug, and forming a top metal layer over the first substrate for MEMS in accordance with some embodiments.
Figure 5:
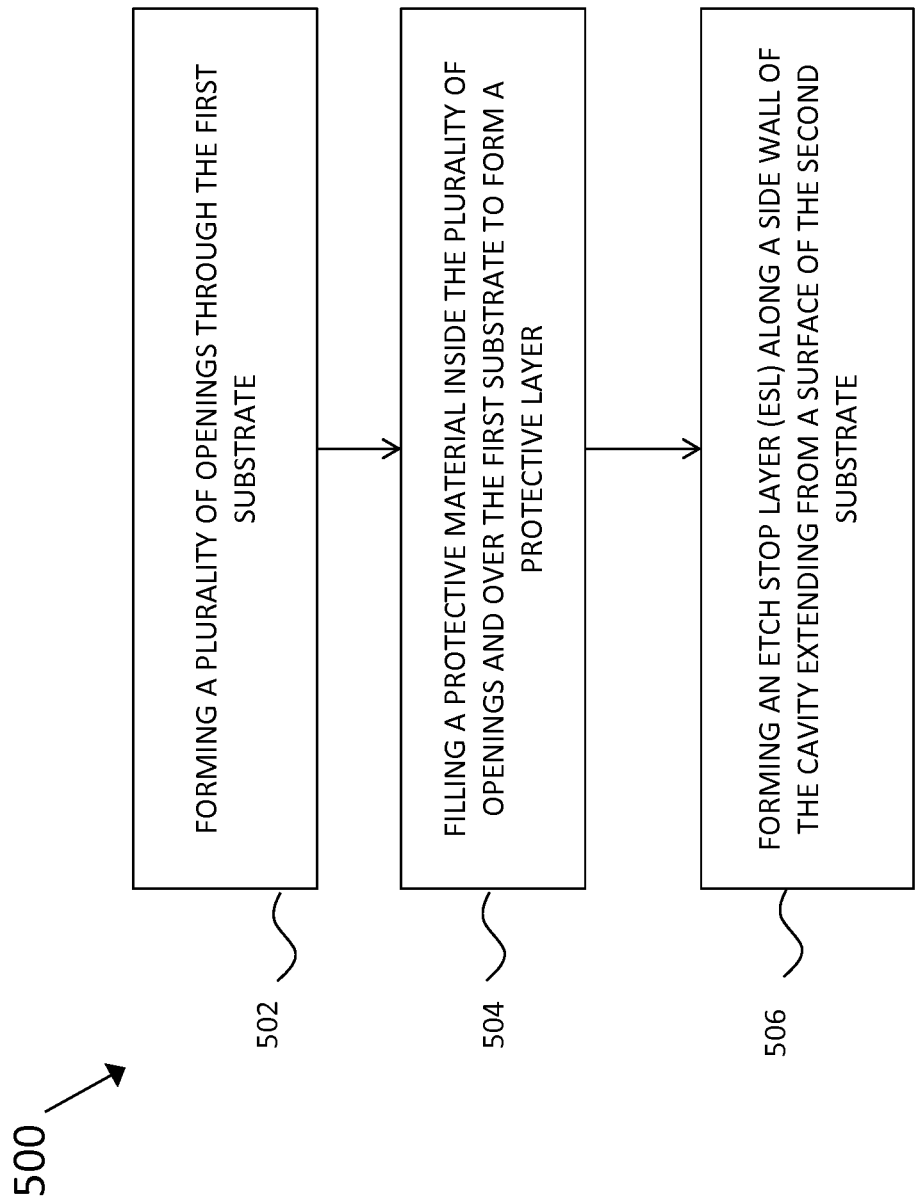
FIG. 5 is a flow chart illustrating a process comprising forming a protective layer over the first substrate for MEMS and forming an etch stop layer (ESL) along a side wall of a cavity extending from a surface of the second substrate to the MEMS device layer, in accordance with some embodiments.
Figure 6:
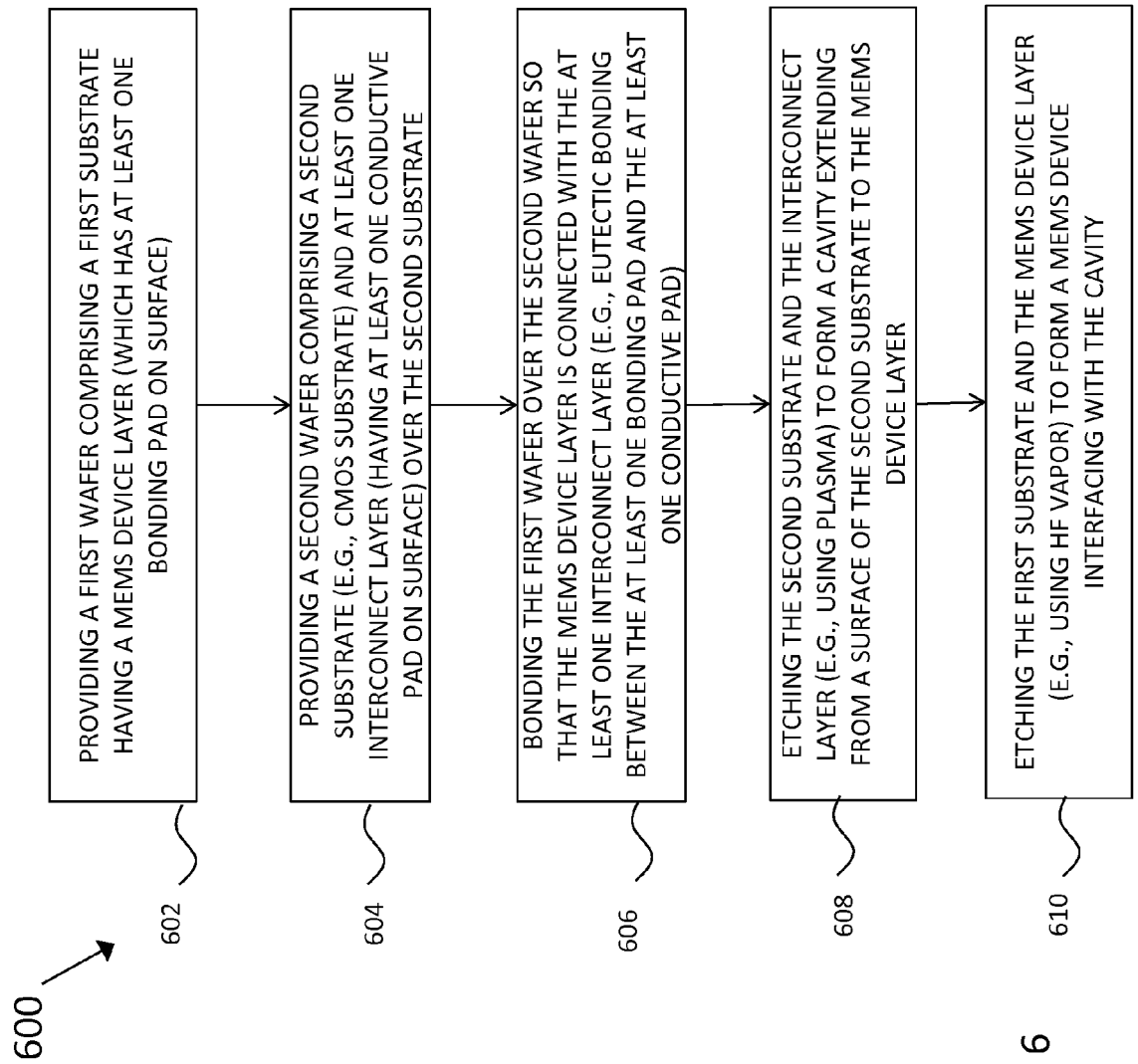
FIG. 6 is a flow chart illustrating an exemplary method for forming an integrated semiconductor device comprising eutectically bonding a first wafer for MEMS and a second wafer for CMOS, in accordance with some embodiments.

In FIGS. 1A-1K and 2A-2K, like items are indicated by like reference numerals, and for brevity, descriptions of the structure, provided above with reference to the previous figures, are not repeated. The methods described in FIG. 3 and FIG. 6 are described with reference to the exemplary structure described in FIGS. 1A-1K and FIGS. 2A-2K, respectively. FIGS. 4 and 5 illustrate supplemental processes, which may be used in the methods of FIG. 3 and FIG. 6, respectively.

FIG. 3 illustrates an exemplary general method 300 for forming an integrated semiconductor device 100 in accordance with some embodiments. FIGS. 1A-1K illustrate a portion of a semiconductor device 100 during fabrication, followings the steps of method 300.

Figure 1B:
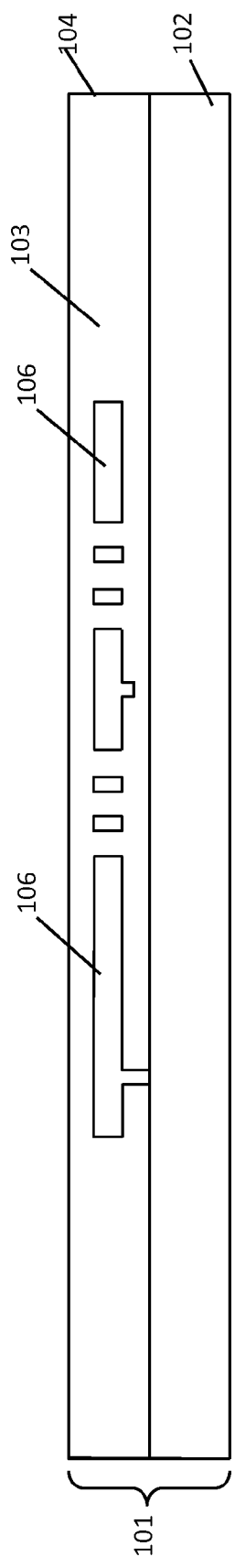

Referring to FIG. 3, at step 302, a first wafer 101 is provided. The first wafer 101 comprises a first substrate 102 having a microelectromechanical system (MEMS) device layer 104. The structure of the first wafer 101 is illustrated in FIGS. 1A and 1B. The first substrate 102 is to be used for fabricating a MEMS device in some embodiments.

The first substrate 102 comprises a semiconductor material. Examples of suitable materials for the first substrate 102 include but are not limited to silicon, germanium, a compound semiconductor, and a semiconductor-on-insulator (SOI) substrate. A compound semiconductor can be an III-V semiconductor compound such as gallium arsenide (GaAs). An SOI substrate can comprise a semiconductor on an insulator such as silicon oxide. Silicon is used in some embodiments. The first substrate 102 may further comprise active layers such as an MOS device structures, bipolar device structures, a p-n junction, any other suitable device structures, and combinations thereof.

The MEMS device layer 104 in the first wafer 101 comprises a dielectric material 103 and at least one MEMS device component 106. Dielectric material 103 can be formed over the first substrate 102, as shown in FIG. 1A. Examples of a suitable dielectric material 103 include but are not limited to silicon oxide, silicon oxynitride, phosphosilicate glass (PSG), borophosphosilicate glass (BPSG), combinations thereof, or other suitable material. Dielectric material 103 can be formed by using CVD, high density plasma CVD, spin-on, sputtering, or other suitable method.

Through a process of patterning and etching, trenches 105 for vias or "anti-stiction bumps" can be formed on the surface or inside dielectric material 103. For example, trenches 105 can be formed using processes such as: spin coating of a photoresist, patterning the photoresist, etching the photoresist to provide a pattern, and using the photoresist pattern as a masking element to pattern dielectric material 103, followed by an etching process such as using plasma, and/or any other suitable process.

At least one MEMS device component 106 can be formed inside dielectric material 103 in the MEMS device layer 104. Meanwhile, more dielectric material 103 can be formed over the substrate. The resulting structure is illustrated in FIG. 1B. In some embodiments, the at least one MEMS device component 106 is formed of polysilicon, single crystal silicon, Ge, a III-V semiconductor compound or any other suitable semiconductor materials. In some embodiments, the at least one MEMS device component 106 shown in FIG. 1B is for a MEMS microphone, made of polysilicon or single crystal silicon. The at least one MEMS device component 106 can include mechanical layer, membrane, diaphragm, or any other functional components for a MEMS microphone. In some embodiments, the at least one MEMS device component 106 comprising polysilicon is formed by using CVD, high density plasma CVD, or other suitable method, at high temperatures. For example, polysilicon can be grown by using CVD at a temperature in the range of from 500° C. to 700° C., for example, from 550° C. to 590° C.

At step 304 of FIG. 3, a second wafer 111 is provided. The structure of an exemplary second wafer 111 is illustrated in FIG. 1C. The second wafer 111 comprises a second substrate 112 having at least one active device, and at least one interconnect layer 114 over the second substrate 112. The second substrate 112 can include bipolar, CMOS, bi-CMOS, or any other active devices, which may include at least one transistor, and/or passive devices. In some embodiments, the second substrate 112 is a CMOS substrate comprising at least one CMOS device.

The second substrate 112 can be a wafer comprising a semiconductor material. Examples of suitable materials for the second substrate 112 include but are not limited to silicon, germanium, a compound semiconductor, and a semiconductor-on-insulator (SOI) substrate. A compound semiconductor can be an III-V semiconductor compound such as gallium arsenide (GaAs). An SOI substrate can comprise a semiconductor on an insulator such as glass. Silicon is used in some embodiments.

The second substrate 112 can also include various layers (not shown) combined to form various microelectronic or IC elements that may include: transistors (for example, metal-oxide-semiconductor field-effect transistors (MOSFETs) such as CMOS transistors, bipolar junction transistors (BJTs), high voltage transistors, high frequency transistors, p-channel and/or n-channel field-effect transistors (PFETs/NFETs); resistors; diodes; capacitors; inductors; fuses; other suitable elements, or combinations thereof. The various layers may include high-k dielectric layers, gate layers, hard mask layers, interfacial layers, capping layers, diffusion/barrier layers, dielectric layers, conductive layers, other suitable layers, or combinations thereof. The various layers of the second substrate 112 may also include various doped regions, isolation features, other features, or combinations thereof. Examples of CMOS devices include but are not limited to a logic device, memory device (for example, a static random access memory (SRAM)), radio frequency (RF) device, input/output (I/O) device, system-on-chip (SoC) device, other suitable type of device, or combinations thereof.

As shown in FIG. 1C, in some embodiments, the at least one interconnect layer 114 in the second wafer 111 comprises an interlayer dielectric (ILD) 115 and at least one conductive structure 116, 118 embedded in the ILD 115.

Examples of suitable materials for the ILD 115 include but are not limited to silicon oxide, silicon oxynitride, phosphosilicate glass (PSG), borophosphosilicate glass (BPSG), combinations thereof, or other suitable material. Low-k, extreme low-k and ultra low-k dielectric materials can also be used. The ILD 115 can be formed by using CVD, high density plasma CVD, spin-on coating, sputtering coating, or other suitable method.

The at least one conductive structure 116, 118 is made of a suitable conductive material, which provides metallization lines within a layer or vias between layers in a semiconductor interconnect structure. In some embodiments, the conductive material comprises tungsten (W), copper (Cu), aluminum (Al), AlCu, silver (Ag), gold (Au), or alloys thereof. The conductive material can be formed by a process such as electric plating, chemical solution deposition, PVD, CVD, ALD and PECVD. Other manufacturing techniques to form the various conductive features may include photolithography processing and etching to pattern conductive materials to form the vertical and horizontal connects or interconnect. Other manufacturing processes may be implemented to the at least one conductive structure 116, 118, such as a thermal annealing to form metal silicide. The metal silicide used in the multilayer interconnects may include nickel silicide, cobalt silicide, tungsten silicide, tantalum silicide, titanium silicide, platinum silicide, erbium silicide, palladium silicide, or combinations thereof. It is understood that the at least one conductive structure 116, 118 may include any number, material, size, and/or dimension of conductive features depending on design requirements of the device to be fabricated.

In some embodiments, horizontal interconnects 116 of the at least one conductive structure 116, 118 are conductive lines, metal routing or inter-metal layer made of AlCu. Vertical interconnect 118 of the at least one conductive structure 116, 118 are vias made of tungsten.

During the fabrication of the CMOS-MEMS integration, the first wafer 101 is flipped. Then, at step 306, the first wafer 101 is bonded over the second wafer 111 so that the MEMS device layer 104 is connected with the at least one interconnect layer 114. The resulting structure is illustrated in FIG. 1D.

In some embodiments, the first wafer is bonded over the second wafer through fusion bonding. For example, the ILD 115 in the at least one interconnect layer 114 in the second wafer 111 can be bonded through fusion bonding with the dielectric material 103 in the MEMS device layer 104 of the first wafer 101. In some embodiments, the ILD 115 and the dielectric material 103 comprise the same composition, for example, silicon dioxide. In some embodiments, after bonding, a thinning process can be used to thin down the first substrate 102 to a desired thickness, for example, in the range from 5 um to 50 um as the remaining thickness of the first wafer 101.

Figure 1E:
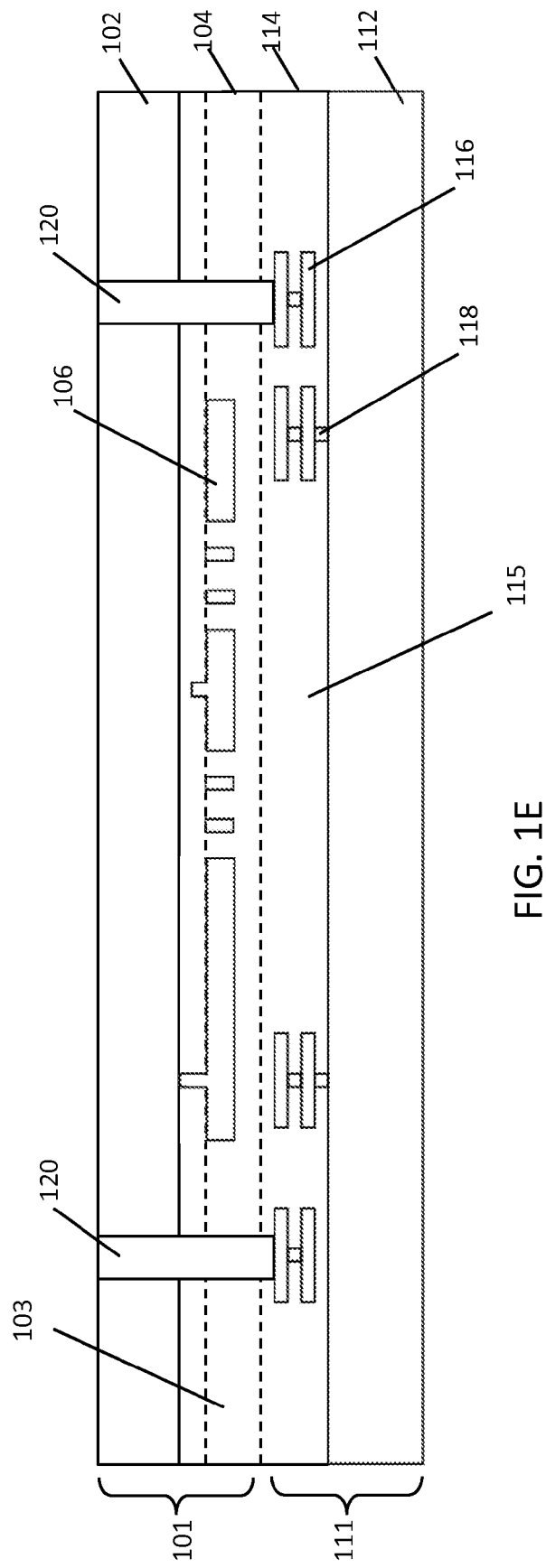

At step 308 of FIG. 3, at least one conductive plug 120 is formed through the first substrate 102 and the MEMS device layer 104 and inside the at least one interconnect layer 114. The resulting structure is illustrated in FIG. 1E. In some embodiments, step 308 comprises at least two steps: steps 402 and 404 of the exemplary process 400 of FIG. 4. At step 402, the first substrate 102, the MEMS device layer 104 and the at least one interconnect layer 114 are etched to form a via (not shown) revealing portion of the at least one conductive structure 116, 118 embedded in the ILD 115. At step 404, the via is filled with a conductive material.

A via for the at least one conductive plug 120 can be formed using processes such as: spin coating of a photoresist, patterning the photoresist, etching the photoresist to provide a pattern, and using the photoresist pattern as a masking element to pattern first substrate 102, dielectric material 103, and part of interconnect layer 114 with an etching process such as using plasma, and/or any other suitable process. The at least one conductive plug 120 can be formed by filling the via with a conductive material, which can be tungsten (W), copper (Cu), or any suitable conductive material. The conductive material for the at least one conductive plug 120 can be formed by a process such as electric plating, chemical solution deposition, PVD, CVD, ALD and PECVD. For example, copper can be formed through an electroplating process. In some embodiments, the at least one conductive plug 120 is made of tungsten, which is made by a process of CVD or PVD.

Figure 1F:
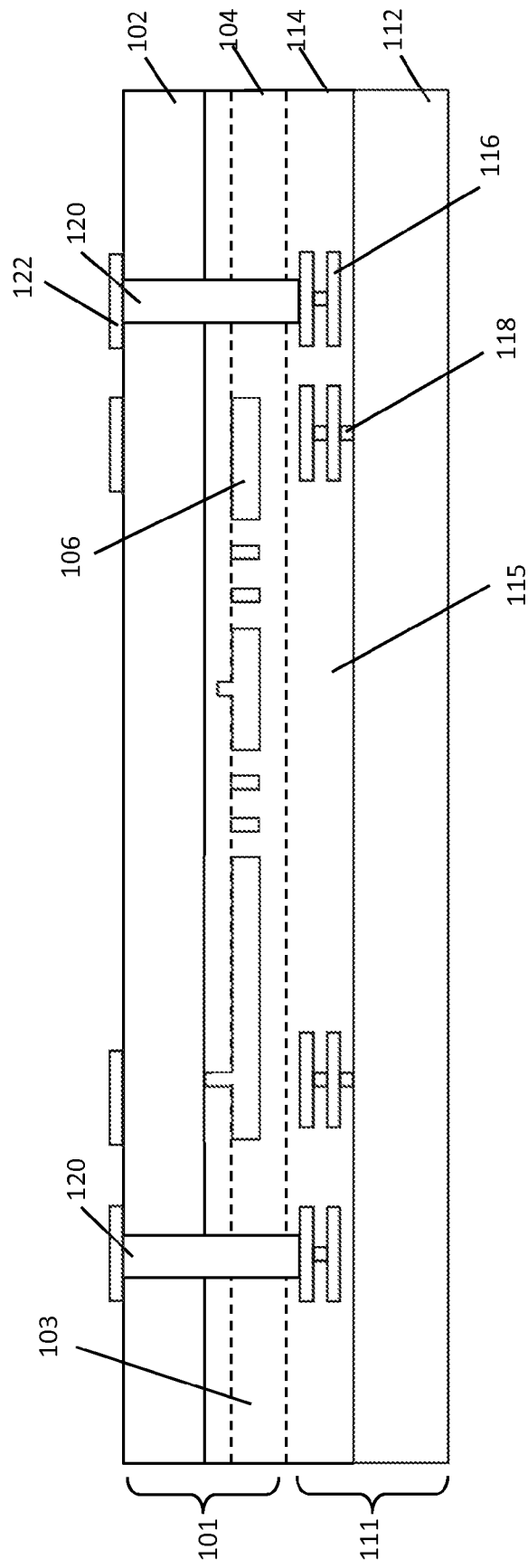

In some embodiments, method 300 also comprises step 406 of FIG. 4: forming a top metal layer 122 over the first substrate 102, which is to be used for forming a MEMS. At step 406, top metal layer 122 is formed over the first substrate 102, and is connected with the at least one conductive plug 120. The resulting structure is shown in FIG. 1F. Top metal layer 122 can be formed using a deposition process such as CVD or PVD, in combination with lithography patterning and etching. Examples of a suitable material for the top metal layer 122 include but are not limited to AlCu, copper (Cu), copper alloy, any other suitable conductive material, or combinations thereof.

Figure 1G:
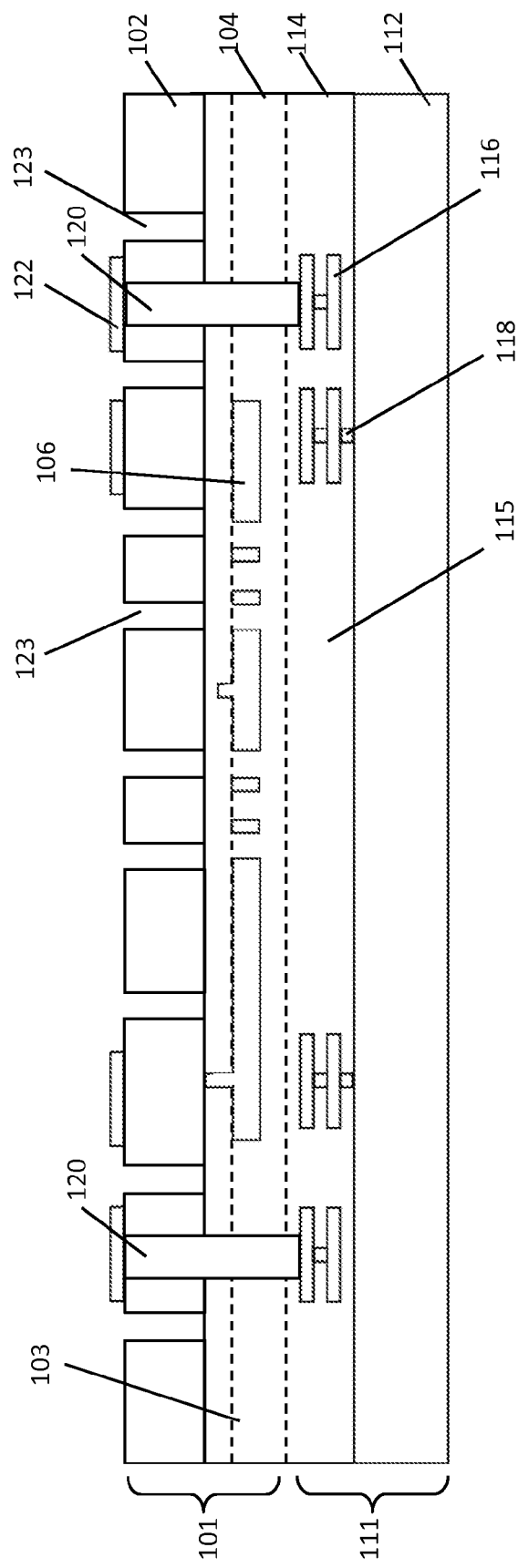
Figure 1H:
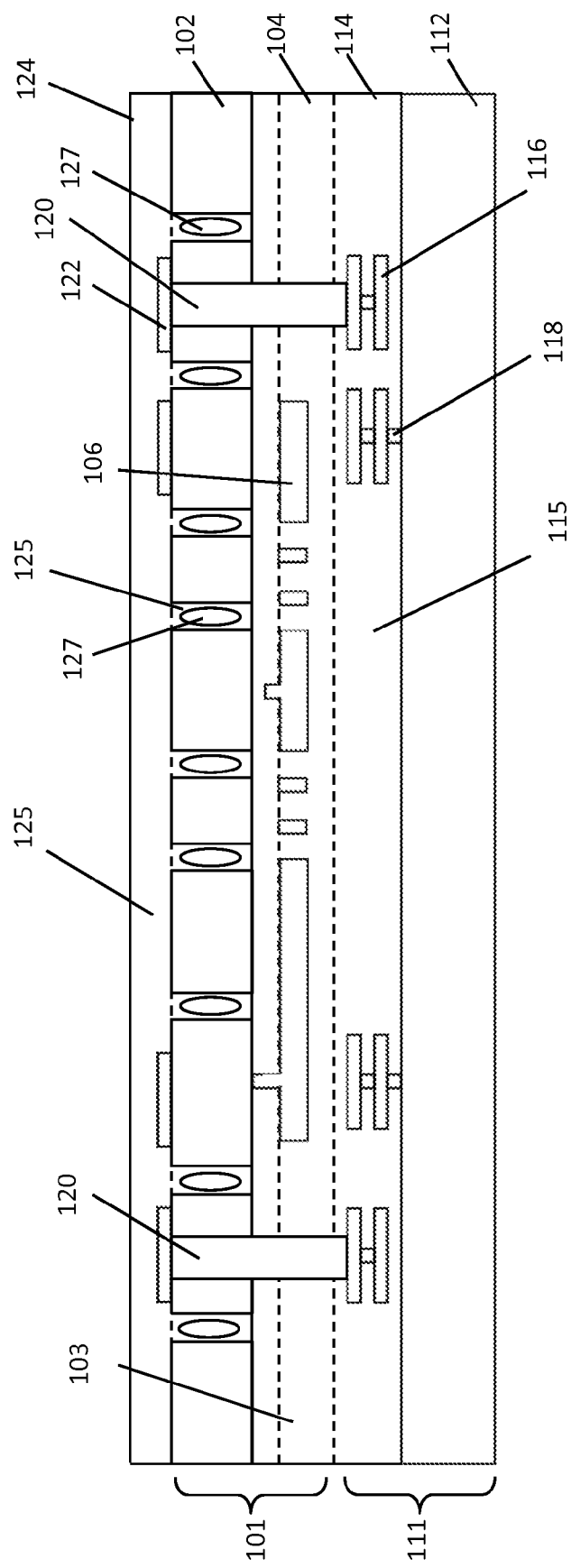

In some embodiments of method 300, steps 502 and 504 in the exemplary process 500 of FIG. 5 are performed, for forming a protective layer 124 over the first substrate 102, before performing etching step 310 of FIG. 3. At step 502, a plurality of openings 123 are formed through the first substrate 102. The resulting structure is shown in FIG. 1G. A plurality of openings 123 can be formed using a lithography process involving photoresist patterning, followed by a process of etching, for example, using plasma. At step 504, a protective material 125 is filled inside the plurality of openings 123 and over the first substrate 102 to form a protective layer 124. The resulting structure is shown in FIG. 1H. Voids 127 may exist in the protective material 125 inside the plurality of openings 123. Examples of a suitable protective material 125 include but are not limited to an oxide, a photoresist, polyimide, and any other suitable materials. In some embodiments, the protective material 125 is silicon oxide.

In some embodiments, steps 502 and 504 are performed, before step 310 of etching the second substrate 112 and the at least one interconnect layer 114.

Figure 1I:
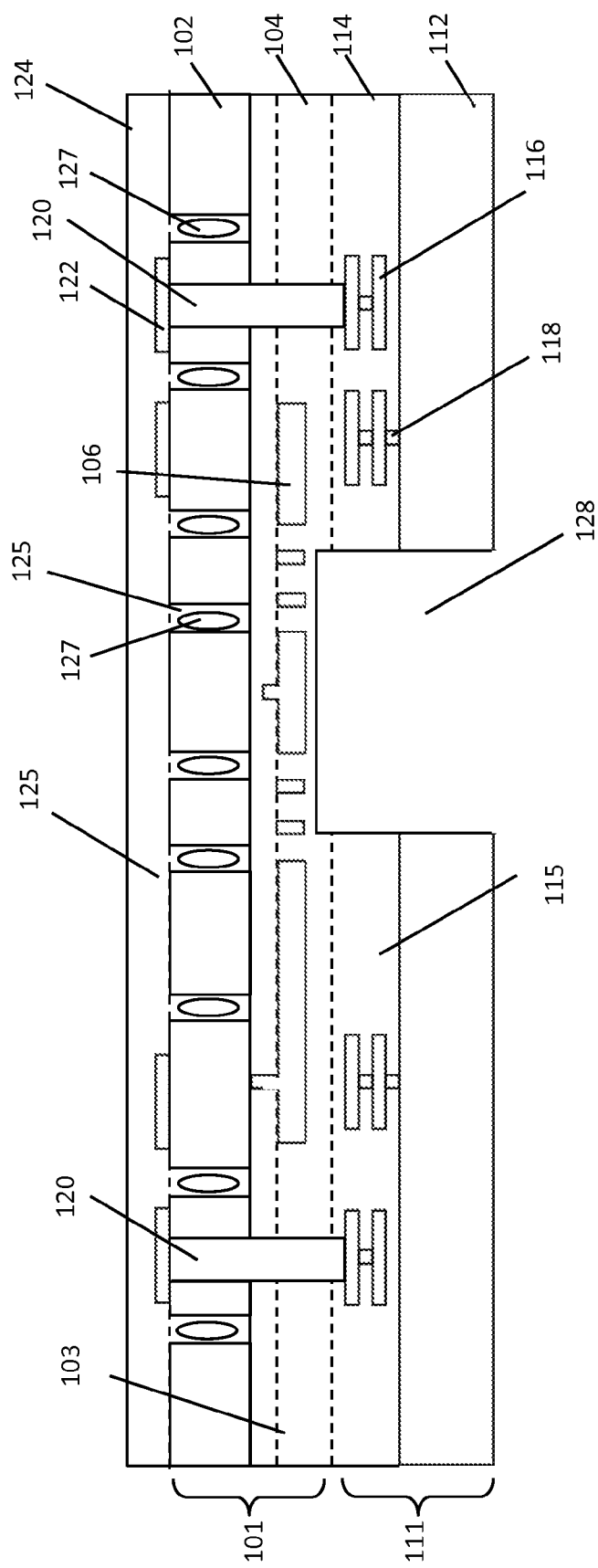

During the fabrication, the device of FIG. 1H is then flipped so that the second substrate 112 faces up. Then, at step 310 of FIG. 3, the second substrate 112 and the at least one interconnect layer 114 are etched to form a cavity 128 extending from a surface of the second substrate 112 to the MEMS device layer 104. The resulting structure is shown in FIG. 1I. Cavity 128 can be formed using a lithography process involving photoresist patterning, followed by a process of etching, which is either a dry etch or a wet etch process. In some embodiments, the step of etching the second substrate 112 and the at least one interconnect layer 114 to form the cavity 128 is performed using plasma. Examples of a suitable etching process include, but are not limited to, using fluorine plasma.

Figure 1J:
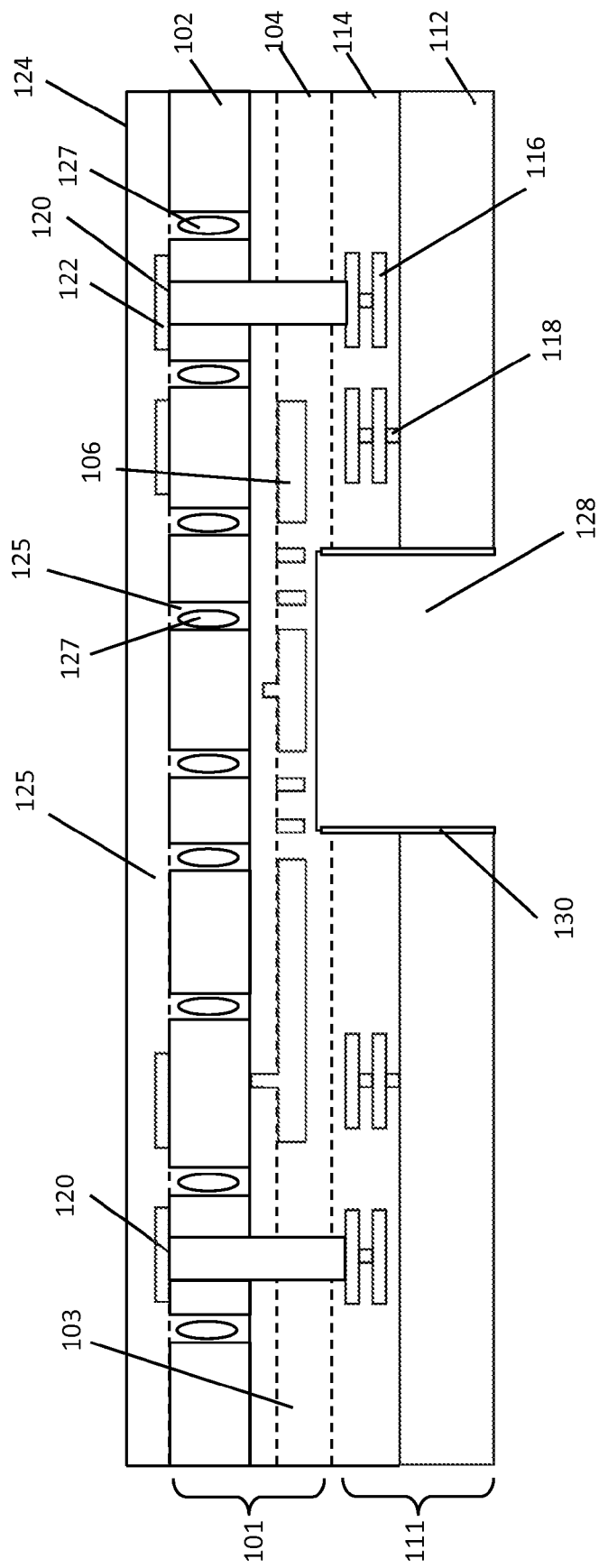

In some embodiments, method 300 further comprises step 506 of FIG. 5: forming an etch stop layer (ESL) 130 along a side wall of the cavity 128 extending from a surface of the second substrate 112. The resulting structure is shown in FIG. 1J. The ESL 130 can be formed of aluminum oxide ($Al_2O_3$), aluminum nitride (AlN), silicon carbide, combinations thereof, or other suitable materials. In some embodiments, the ESL 130 is formed of aluminum oxide ($Al_2O_3$). The ESL 130 can be formed by using chemical vapor deposition (CVD), high density plasma CVD, atomic layer deposition (ALD), sputtering, or other suitable method. There can also be a dry etching process applied after the deposition process of etch stop layer (ESL) 130, which helps to leave the ESL 130 only remained on the sidewall of cavity 128, but free from the bottom of it.

Figure 1K:
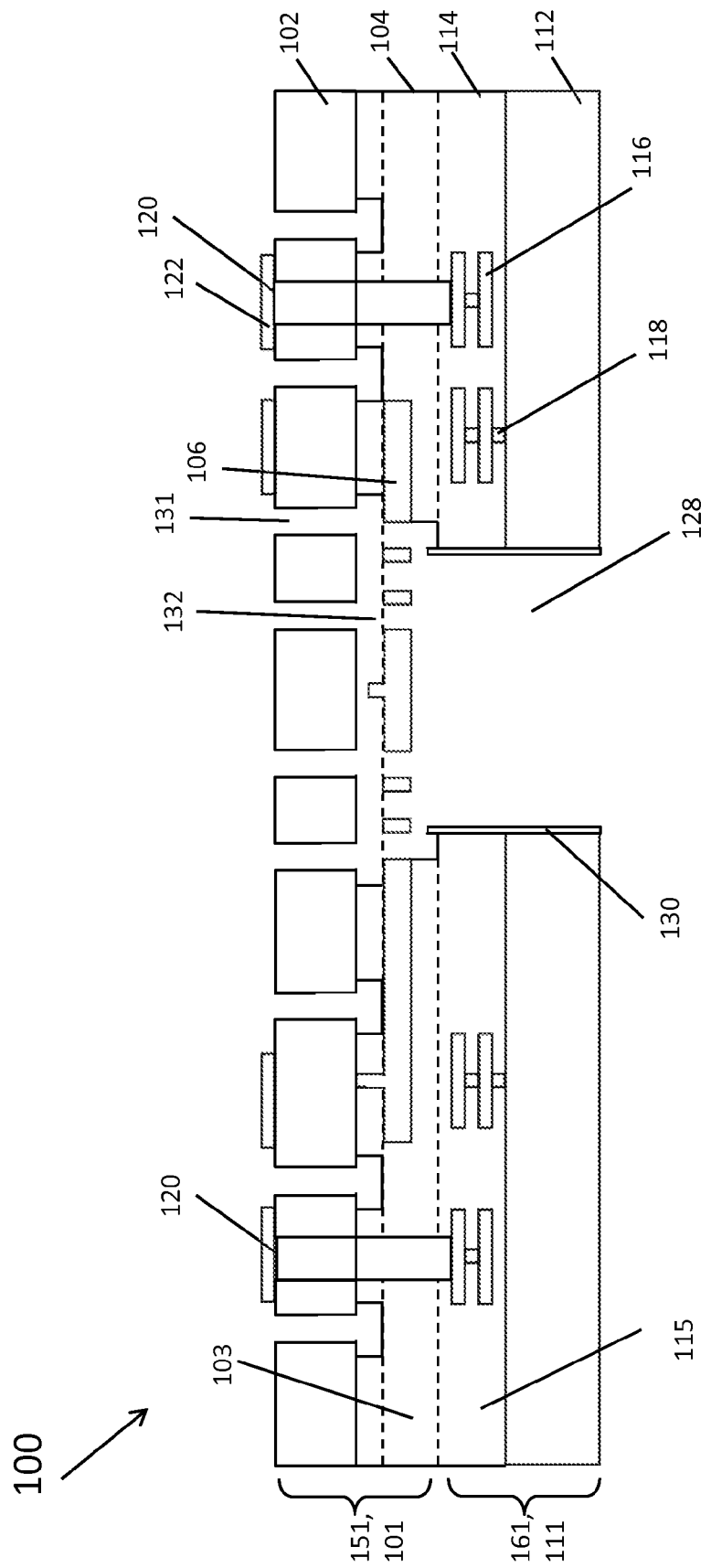

The device of FIG. 1J is then flipped so that the first wafer 101 faces up. Then, at step 312, the first substrate 102 and the MEMS device layer 104 are etched to form a MEMS device interfacing with the cavity 128. The resulting structure is shown in FIG. 1K. This step of etching can be performed using a vapor etching process or a wet etch process. In some embodiments, step 312 is performed using hydrofluoric (HF) acid vapor. The ESL 130 comprising a chemical resistant material such as aluminum oxide, silicon carbide and aluminum nitride is optionally used to protect other device portion from HF vapor. The MEMS structure shown in FIG. 1K is a MEMS microphone for illustration purpose, but other MEMS devices can be formed using the method. Cavity 128 is the sound port for the MEMS microphone. In the MEMS device, as shown in FIG. 1K, openings 131 and 132 interface with cavity 128.

FIG. 6 illustrates another exemplary method 600 for forming an integrated semiconductor device 200. Method 600 comprises eutectically bonding a first wafer 201 for MEMS and a second wafer 211, in accordance with some embodiments. Method 600 of FIG. 6 is described with reference to the exemplary structures described in FIGS. 2A-2K.

At step 602, a first wafer 201 is provided. The first wafer 201 comprises a first substrate 102 having a MEMS device layer 104, and at least one bonding pad 108 on a surface of the MEMS device layer 104. The structure of an exemplary first wafer 201 is illustrated in FIG. 2C. The first wafer 201 of FIG. 2C can be made from the structures in FIGS. 2A and 2B, which are similar to, or the same as, those described in FIGS. 1A and 1B. For brevity, descriptions of like structures also shown in FIGS. 1A and 1B are not repeated. In some embodiments, the MEMS device layer 104 in the first wafer 201 comprises a dielectric material 103 and at least one MEMS device component 106.

Figure 2A:
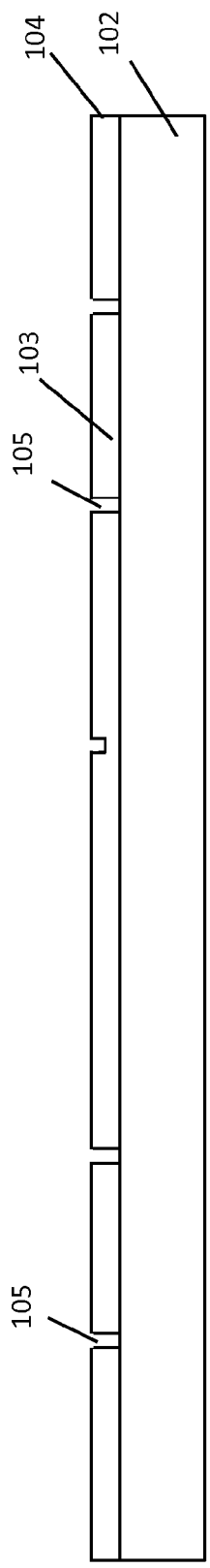
Figure 2B:
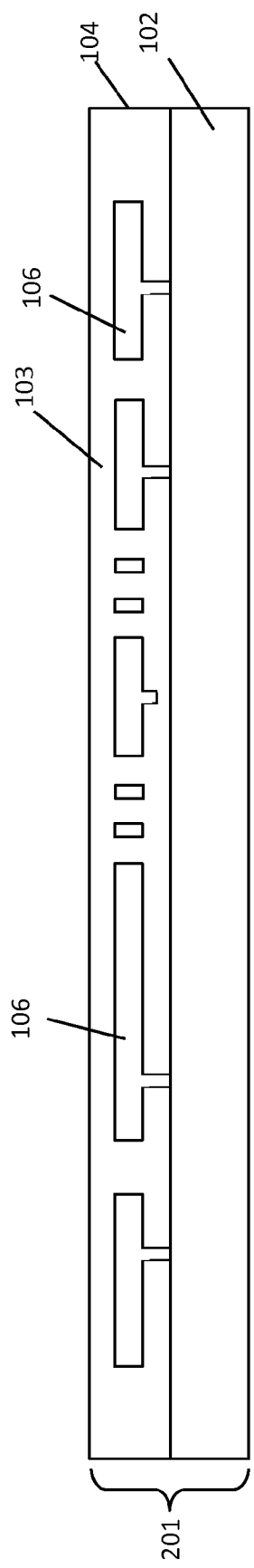
Figure 2C:
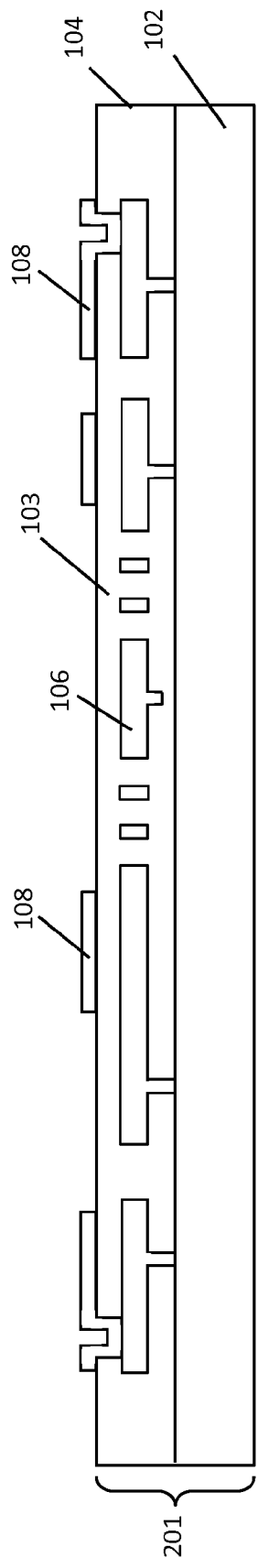

The at least one bonding pad 108 can be formed over a top surface of the MEMS device layer 104 and over the trenches 105 in the structure of FIG. 2B. The at least one bonding pad 108 can be also the form of a ring around trench 105. Examples of a suitable material for the at least one bonding pad 108 include but are not limited to Ge, AlCu, Al, Au and any suitable conductive material. The at least one bonding pad 108 can be formed by a process such as electric plating, chemical solution deposition, PVD, CVD, ALD and PECVD. The at least one bonding pad 108 having a specific shape or size can be formed through a process of patterning and etching.

Figure 2D:
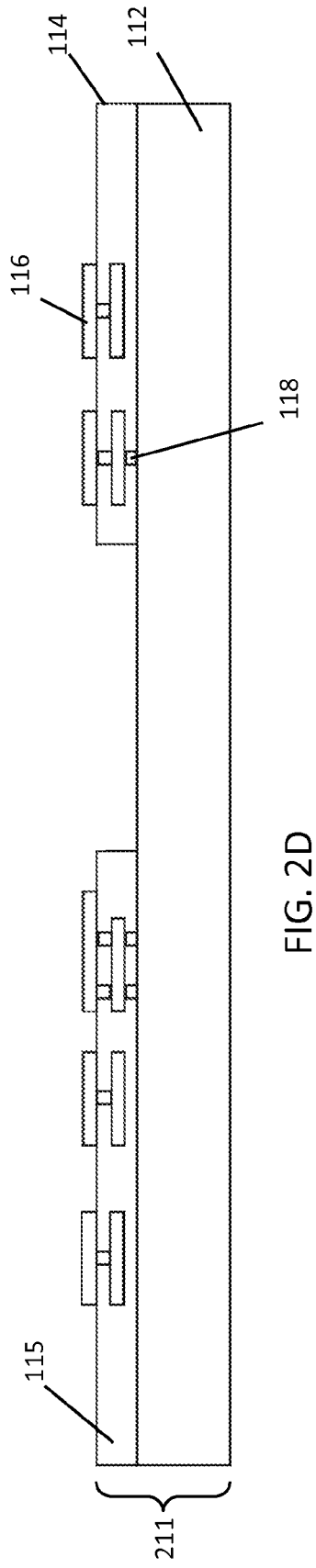

At step 604, a second wafer 211 is provided. The structure of an exemplary second wafer 211 is illustrated in FIG. 2D. In some embodiments, the second substrate 112 is a CMOS substrate comprising at least one CMOS device.

The second wafer 211 comprises a second substrate 112 having at least one active device, at least one interconnect layer 114 over the second substrate 112. As shown in FIG. 2D, in some embodiments, the at least one interconnect layer 114 in the second wafer 211 comprises an interlayer dielectric (ILD) 115 and at least one conductive structure 116, 118 embedded in the ILD 115. The ILD 115 and the at least one conductive structure 116, 118 are described in FIG. 1C. In addition, the at least one interconnect layer 114 has at least one conductive pad 116 thereon. In some embodiments, the at least one conductive pad 116 comprises AlCu, Ge, Al, Au and any suitable conductive material. In some embodiments, an area can be cleared out in the at least one interconnect layer 114, for providing an etch-through channel for later process steps.

Figure 2E:
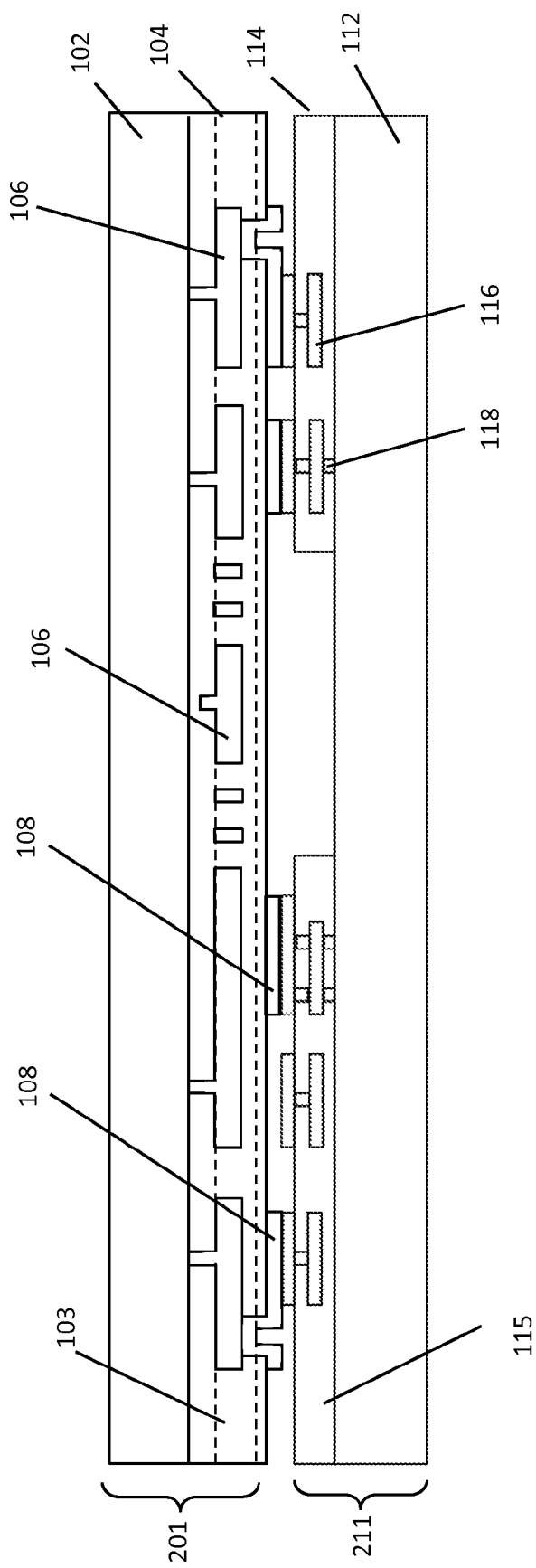

At step 606, the first wafer 201 is flipped and bonded over the second wafer 211 so that the MEMS device layer 104 is connected with the at least one interconnect layer 114. The resulting structure is shown in FIG. 2E. In some embodiments, the first wafer 201 is bonded over the second wafer 211 through eutectic bonding between the at least one bonding pad 108 on the surface of the MEMS device layer 104 and the at least one conductive pad 116 on the at least one interconnect layer 114. A suitable eutectic reaction occurs between the material pair such as Al—Ge, Au—Au, Al—Al and Al—Au at a suitable eutectic temperature. For example, a suitable eutectic temperature is less than <450° C. in some embodiments. In some embodiments, after bonding, a thinning process can be used to thin down the first substrate 102 to a desire thickness, for example, in the range of from 5 um to 50 um.

Figure 2F:
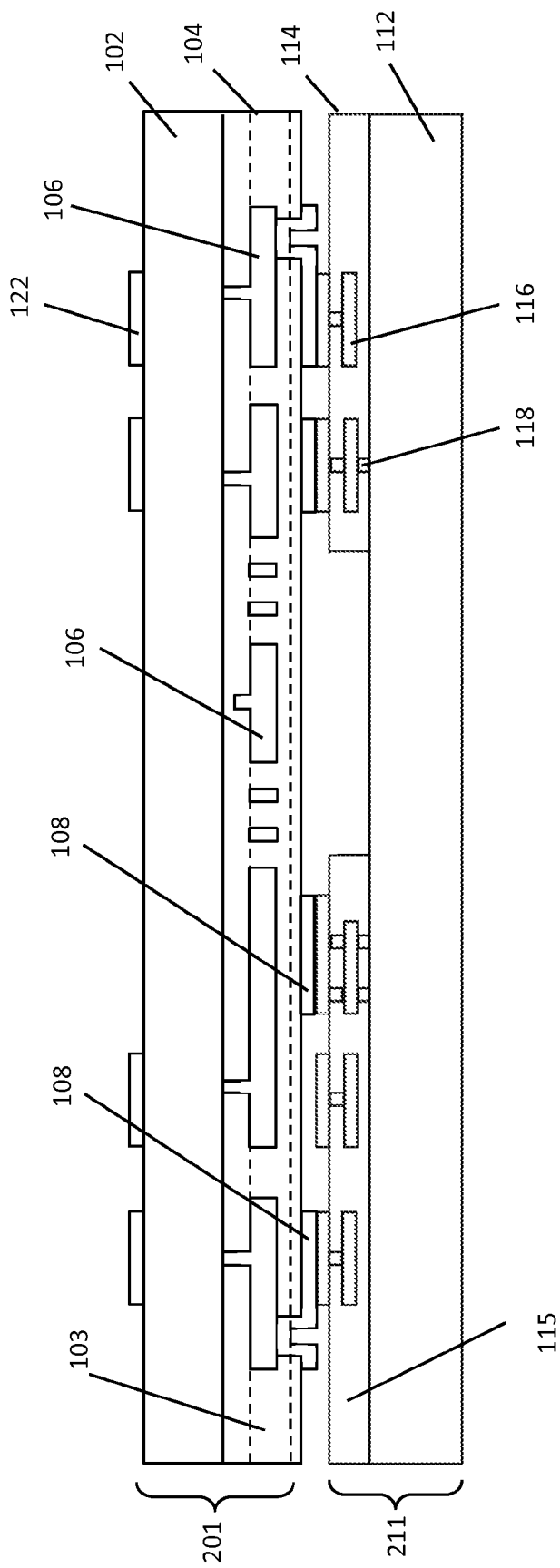

In some embodiments, method 600 further comprises a step of forming a top metal layer 122 over the first substrate 102, after bonding the first wafer 201 over the second wafer 211. The resulting structure is illustrated in FIG. 2F. This step of forming a top metal layer 122 is described at step 406 of FIG. 4.

Figure 2G:
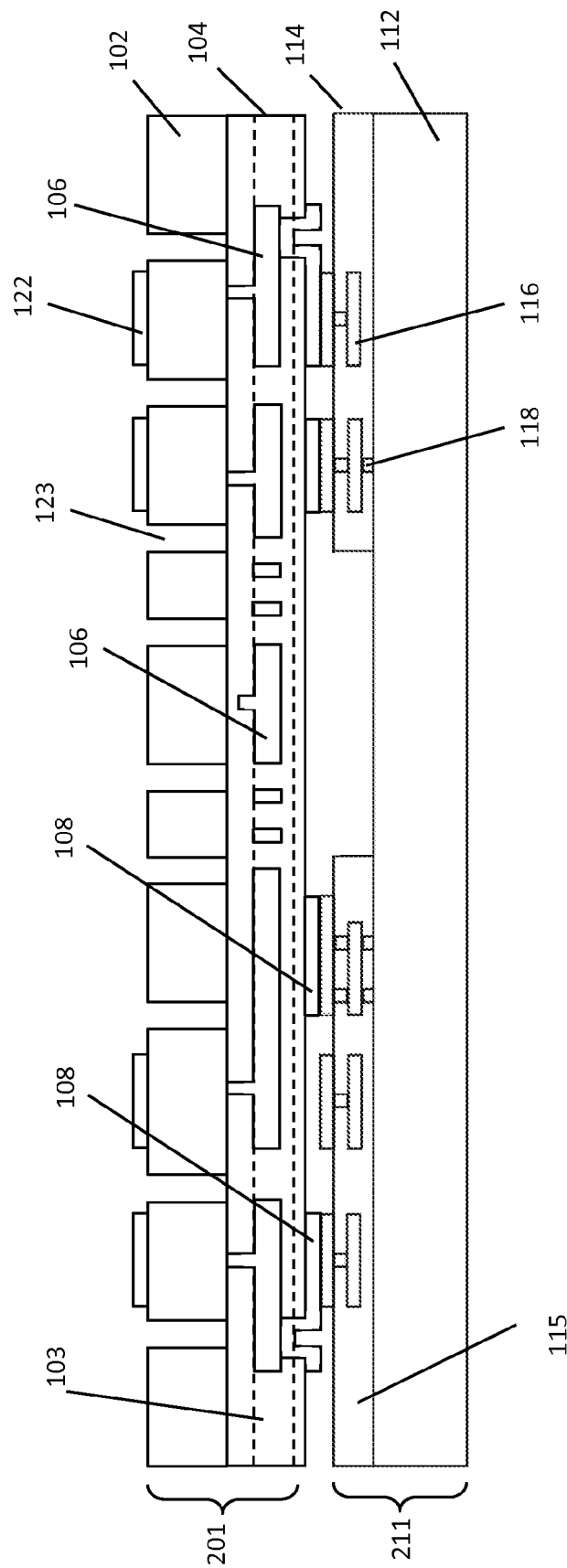
Figure 2H:
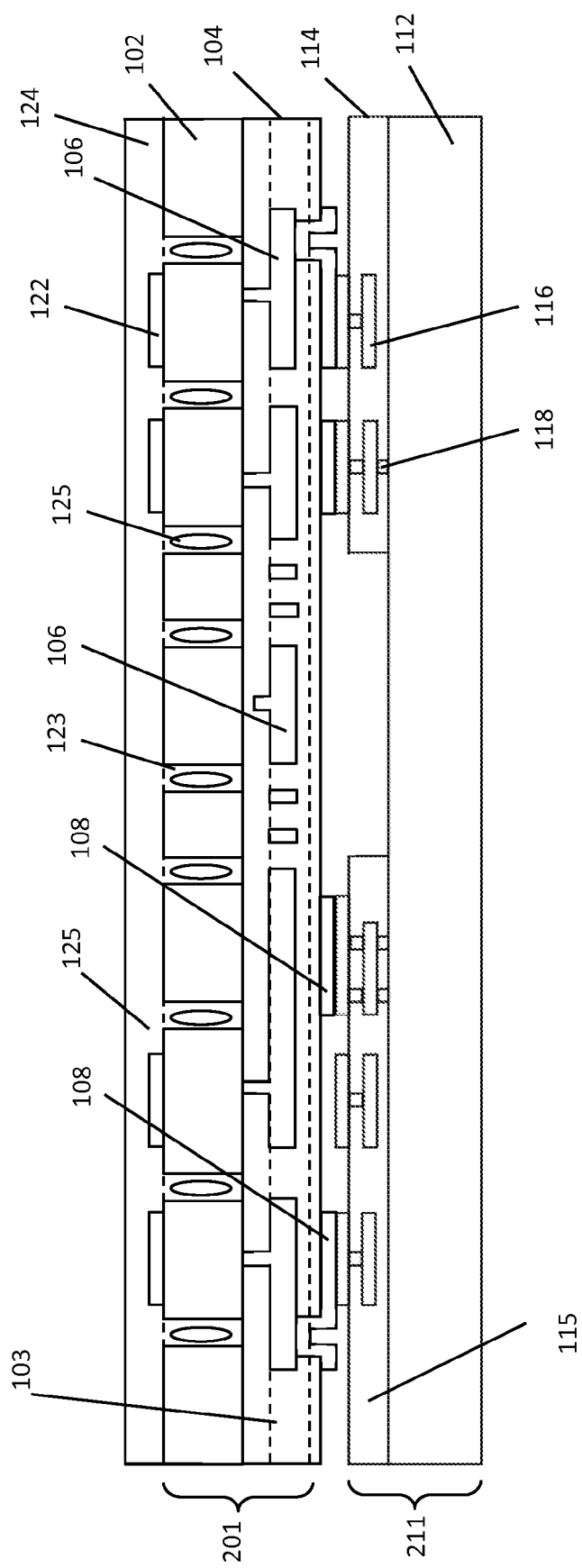
Figure 21:
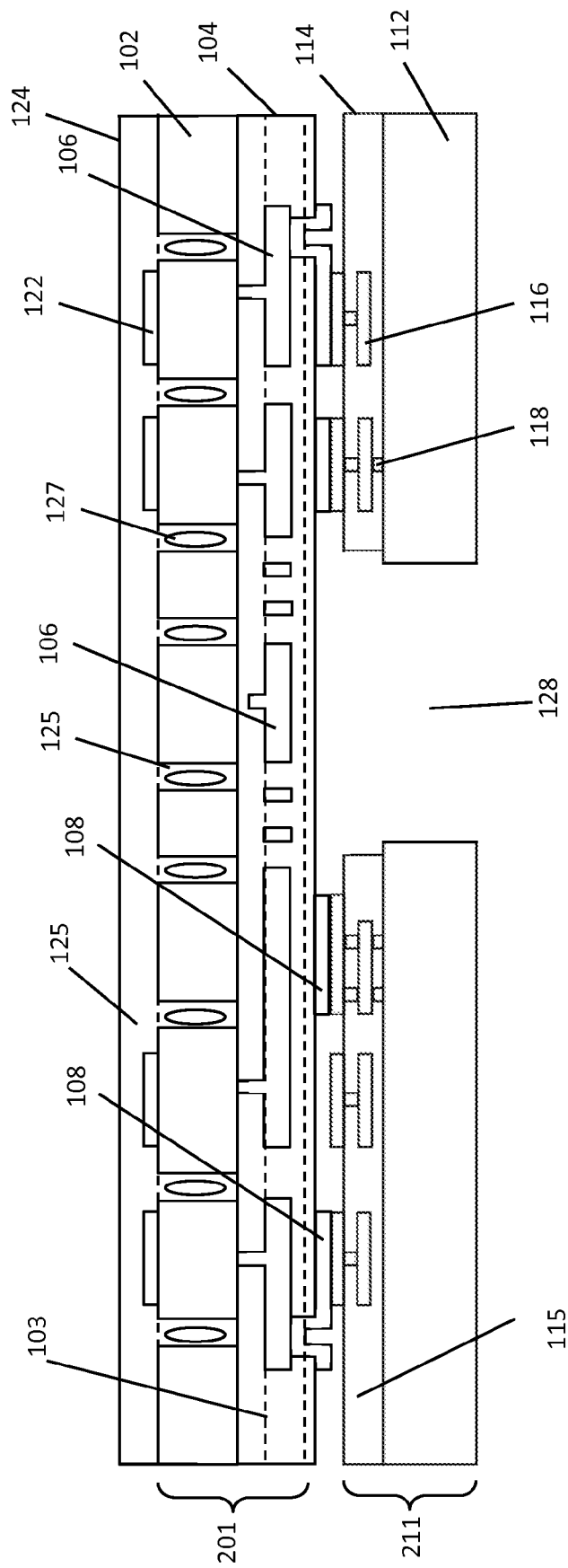

Method 600 may also comprise steps 502 and 504 of FIG. 5 as described above, for forming a protective layer 124 over the first substrate 102. In some embodiments, a plurality of openings 123 are formed through the first substrate 102, and then a protective material 125 is filled inside the plurality of openings 123 and over the first substrate 102 to form a protective layer 124. The related structures are illustrated in FIGS. 2G and 2H, respectively. Steps 502 and 504 are performed before the step of etching the second substrate 112 and the at least one interconnect layer 114.

Referring back to FIG. 6, at step 608 as step 310 described above, the second substrate 112 and the at least one interconnect layer 114 are etched to form a cavity 128 extending from a surface of the second substrate 112 to the MEMS device layer 104. The resulting structure is shown in FIG. 2I. In some embodiments, the step of etching the second substrate 112 and the at least one interconnect layer 114 to form the cavity 128 is performed using plasma. Examples of a suitable etching process include but are not limited to using fluorine plasma. In some embodiments, at step 608, the etching area of the second substrate 112 can be substantially aligned with the previously cleared-out area, or the etch-through channel in the at least one interconnect layer 114, which provides a shorter etch time and better process control in forming the cavity 128.

Figure 2J:
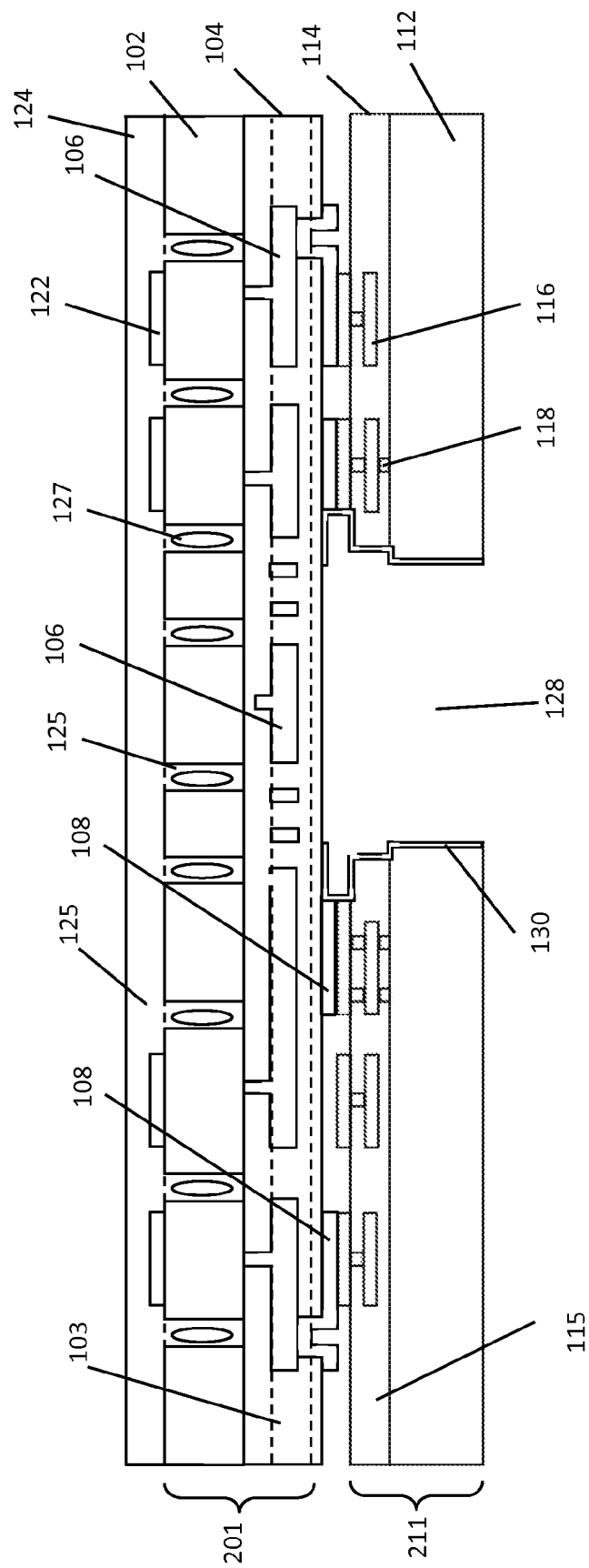

In some embodiments, method 600 may also include step 506 of FIG. 5 as described above for forming an etch stop layer (ESL) 130 along a side wall of the cavity 128, after step 608. The resulting structure is shown in FIG. 2J.

Figure 2K:
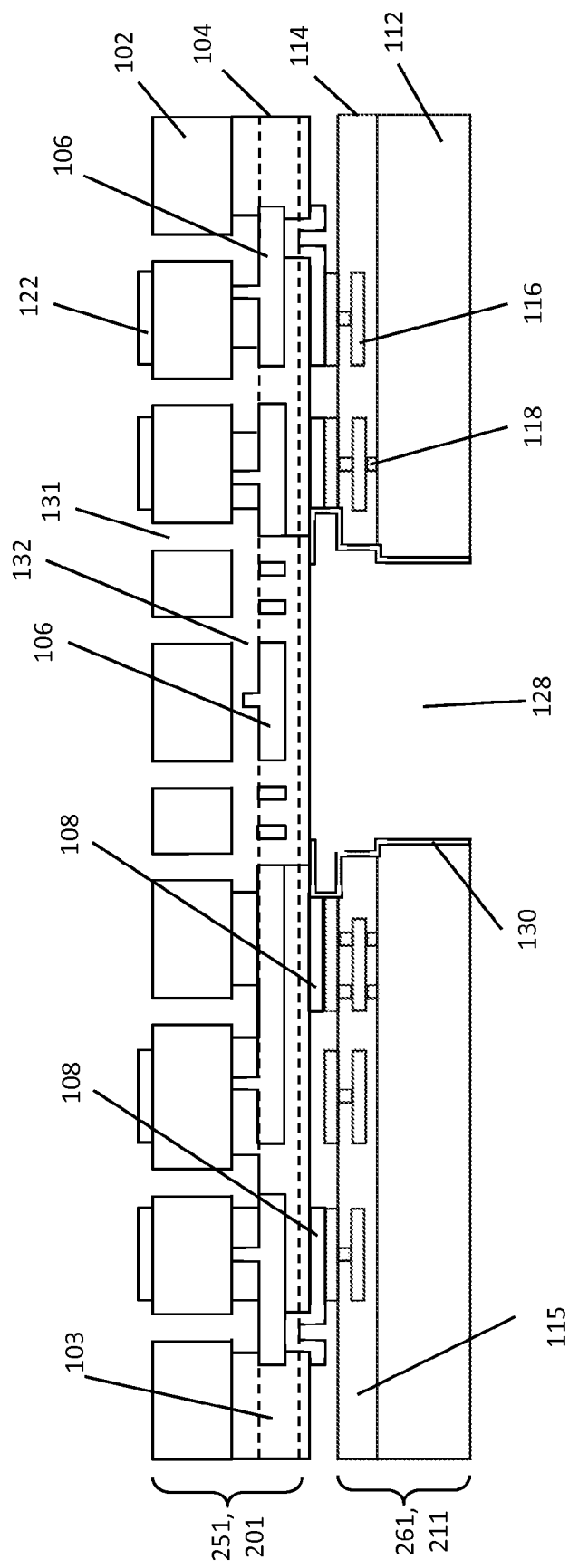

At step 610, the first substrate 102 and the MEMS device layer 104 are etched to form a MEMS device interfacing with the cavity 128. The resulting structure is shown in FIG. 2K. Step 610 is the same as step 312 as described. This step of etching can be performed using a wet etching process or a vapor etching process. In some embodiments, step 610 is performed using hydrofluoric (HF) acid vapor. The ESL 130 comprising a chemical resistant material such as aluminum oxide, silicon carbide and aluminum nitride are used to protect other device portion from HF vapor. The MEMS structure 200 made by method 600 as shown in FIG. 2K is a MEMS microphone for illustration purpose. Cavity 128 is the sound port for the MEMS microphone.

In some embodiments, an integrated semiconductor device 100 or 200 is provided, as shown in FIG. 1K and FIG. 2K, respectively. The device 100 or 200 comprises a first chip 151 or 251 and a second chip 161 or 261. The chips are from the respective wafers in the processing steps. The wafer portions singulate to form stacked chips. The first chip 151 or 251 is from the first wafer 101 or 201, respectively. The second chip 161 or 261 is from the second wafer 111 or 211, respectively. The first chip 151 or 251 comprises a first substrate 102 having a MEMS device layer 104. The MEMS device layer 104 includes components for a MEMS device. The second chip 161 or 261 comprises a second substrate 112 having at least one active device and at least one interconnect layer 114 over the second substrate 112. The first chip 151 or 251 is bonded over the second chip 161 or 261. The MEMS device layer 104 is connected with the at least one interconnect layer 114. The second chip 161 or 261 has a cavity 128 extending from a surface of the second substrate 112 to the MEMS device layer 104. The MEMS device interfaces with the cavity 128.

In some embodiments, the MEMS device is a MEMS microphone. The second substrate 112 is an active device substrate (e.g., a CMOS substrate comprising at least one CMOS device). In some embodiments, the MEMS device layer 104 in the first chip 151 or 251 comprises a dielectric material 103 and at least one MEMS device component 106. The at least one interconnect layer 114 in the second chip 161 or 261 comprises an ILD 115 and at least one conductive structure 116, 118 embedded in the ILD 115. In some embodiments, the ILD 115 is bonded with the dielectric material 103 in the MEMS device layer 104, through a process such as fusion bonding between the ILD 115 and the dielectric material 103.

In some embodiments, the MEMS device layer 104 in the first chip 261 further comprises at least one bonding pad 108 on a surface of the MEMS device layer 104. The at least one interconnect layer 114 in the second chip 261 further comprises at least one conductive pad 116 on a surface of the at least one interconnect layer 114. The at least one bonding pad 108 on the surface of the MEMS device layer 104 are bonded with the at least one conductive pad 116 on the at least one interconnect layer 114, through a process such as eutectic bonding. In some embodiments, the integrated semiconductor device 100 or 200 further comprises at least one conductive plug 120 through the first substrate 102 and the MEMS device layer 104 and inside the at least one interconnect layer 114, and a top metal layer 122 over the first substrate 102 and connected with the at least one conductive plug 120.

The present disclosure provides a method for forming an integrated semiconductor device, particularly a method for integrating CMOS and MEMS device structures at wafer level, and the resulting integrated semiconductor device.

In one aspect, a method for forming an integrated semiconductor device comprises providing a first wafer, providing a second wafer, and bonding the first wafer over the second wafer. The first wafer comprises a first substrate having a microelectromechanical system (MEMS) device layer. The second wafer comprises a second substrate having at least one active device, and at least one interconnect layer over the second substrate. After the step of bonding, the MEMS device layer is connected with the at least one interconnect layer. The method further includes forming at least one conductive plug through the first substrate and the MEMS device layer and inside the at least one interconnect layer, etching the second substrate and the at least one interconnect layer to form a cavity extending from a surface of the second substrate to the MEMS device layer, and etching the first substrate and the MEMS device layer to form a MEMS device interfacing with the cavity.

In some embodiments, the second substrate is a complementary metal-oxide-semiconductor (CMOS) substrate comprising at least one CMOS device. Bonding the first wafer over the second wafer is performed through fusion bonding. In some embodiments, the at least one interconnect layer in the second wafer comprises an interlayer dielectric (ILD) and at least one conductive structure embedded in the ILD. The MEMS device layer in the first wafer comprises a dielectric material and at least one MEMS device component. In some embodiments, the step of forming at least one conductive plug comprises etching the first substrate, the MEMS device layer and the at least one interconnect layer to form a via connected with the at least one conductive structure embedded in the ILD, and filling the via with a conductive material.

In some embodiments, the method further comprises forming a top metal layer over the first substrate and connected with the at least one conductive plug. In some embodiments, the method also comprises forming a plurality of openings through the first substrate, and filling a protective material inside the plurality of openings and over the first substrate to form a protective layer, before the step of etching the second substrate and the at least one interconnect layer to form the cavity extending from a surface of the second substrate. In some embodiments, the method further comprises forming an etch stop layer (ESL) along a side wall of the cavity extending from a surface of the second substrate.

In some embodiments, the step of etching the second substrate and the at least one interconnect layer to form the cavity is performed using plasma. The step of etching the first substrate and the MEMS device layer to form a MEMS device is performed using hydrofluoric acid vapor.

In accordance with some embodiments, a method for forming an integrated semiconductor device comprises providing a first wafer, and providing a second wafer. The first wafer comprises a first substrate having a MEMS device layer, and at least one bonding pad on a surface of the MEMS device layer. The second wafer comprises a second substrate having at least one active device, at least one interconnect layer over the second substrate. The at least one interconnect layer has at least one conductive pad thereon. The method further comprises bonding the first wafer over the second wafer so that the MEMS device layer is connected with the at least one interconnect layer. The method further comprises etching the second substrate and the at least one interconnect layer to form a cavity extending from a surface of the second substrate to the MEMS device layer, and etching the first substrate and the MEMS device layer to form a MEMS device interfacing with the cavity.

In some embodiments, the second substrate is a CMOS substrate comprising at least one CMOS device. The bonding the first wafer over the second wafer is performed through eutectic bonding between the at least one bonding pad on the surface of the MEMS device layer and the at least one conductive pad on the at least one interconnect layer. In some embodiments, the at least one interconnect layer in the second wafer comprises an interlayer dielectric (ILD) and at least one conductive structure embedded in the ILD. The MEMS device layer in the first wafer comprises a dielectric material and at least one MEMS device component.

In some embodiments, the method further comprises forming a top metal layer over the first substrate, after bonding the first wafer over the second wafer. The method comprises forming an etch stop layer (ESL) along a side wall of the cavity, after etching the second substrate and the at least one interconnect layer to form the cavity extending from a surface of the second substrate to the MEMS device layer.

In some embodiments, the method further comprises forming a plurality of openings through the first substrate, and filling a protective material inside the plurality of openings and over the first substrate to form a protective layer, before the step of etching the second substrate and the at least one interconnect layer to form the cavity extending from a surface of the second substrate to the MEMS device layer. In some embodiments, the step of etching the second substrate and the interconnect layer to form the cavity is performed using plasma. The step of etching the first substrate and the MEMS device layer to form a MEMS device interfacing with the cavity extending from a surface of the second substrate is performed using hydrofluoric acid vapor.

In another aspect, the present disclosure provides an integrated semiconductor device. The device comprises a first chip, and a second chip. The first chip comprising a first substrate having a MEMS device layer, which includes a MEMS device. The second chip comprises a second substrate having at least one active device and at least one interconnect layer over the second substrate. The first chip is bonded over the second chip. The MEMS device layer is connected with the at least one interconnect layer. The second chip has a cavity extending from a surface of the second substrate to the MEMS device layer. The MEMS device interfaces with the cavity extending from the surface of the second substrate to the MEMS device layer.

In some embodiments, the MEMS device is a MEMS microphone. The second substrate is a CMOS substrate comprising at least one CMOS device. In some embodiments, the MEMS device layer in the first wafer comprises a dielectric material and at least one MEMS device component. The at least one interconnect layer in the second chip comprises an interlayer dielectric (ILD) and at least one conductive structure embedded in the ILD. The ILD in the at least one interconnect layer is bonded with the dielectric material in the MEMS device layer.

In some embodiments, the MEMS device layer in the first chip further comprises at least one bonding pad on a surface of the MEMS device layer. The at least one interconnect layer in the second chip further comprises at least one conductive pad on a surface of the at least one interconnect layer. The at least one bonding pad on the surface of the MEMS device layer are bonded with the at least one conductive pad on the at least one interconnect layer. In some embodiments, the integrated semiconductor device further at least one conductive plug through the first substrate and the MEMS device layer and inside the at least one interconnect layer, and a top metal layer over the first substrate and connected with the at least one conductive plug.

Although the subject matter has been described in terms of exemplary embodiments, it is not limited thereto. Rather, the appended claims should be construed broadly, to include other variants and embodiments, which may be made by those skilled in the art.

What is claimed is:

1. A method for forming an integrated semiconductor device, comprising:
   providing a first wafer, the first wafer comprising a first substrate having a microelectromechanical system (MEMS) device layer;
   providing a second wafer, the second wafer comprising a second substrate having at least one active device, and at least one interconnect layer over the second substrate, the at least one interconnect layer comprising an interlayer dielectric (ILD) and at least one conductive structure embedded inside the ILD;
   bonding the first wafer over the second wafer so that the MEMS device layer is connected with the at least one interconnect layer;
   forming at least one conductive plug through the first substrate and the MEMS device layer and inside the at least one interconnect layer, the at least one conductive plug comprising a metal and contacting the at least one conductive structure;
   etching the second substrate and the at least one interconnect layer to form a cavity extending from a surface of the second substrate to the MEMS device layer; and
   etching the first substrate and the MEMS device layer to form a MEMS device interfacing with the cavity extending from a surface of the second substrate to the MEMS device layer.

2. The method of claim 1, wherein
   the second substrate is a complementary metal-oxide-semiconductor (CMOS) substrate comprising at least one CMOS device; and
   bonding the first wafer over the second wafer is performed through fusion bonding.

3. The method of claim 1, wherein the step of forming at least one conductive plug comprises
   etching the first substrate, the MEMS device layer and the at least one interconnect layer to form a via connected with the at least one conductive structure embedded in the ILD; and
   filling the via with a conductive material.

4. The method of claim 1, further comprising forming a top metal layer over the first substrate and connected with the at least one conductive plug.

5. The method of claim 1, further comprising:
   forming a plurality of openings through the first substrate; and
   filling a protective material inside the plurality of openings and over the first substrate to form a protective layer before the step of etching the second substrate and the at least one interconnect layer to form the cavity extending from a surface of the second substrate.

6. The method of claim 1, further comprising:
   forming an etch stop layer (ESL) along a side wall of the cavity extending from a surface of the second substrate.

7. The method of claim 1, wherein
   the step of etching the second substrate and the at least one interconnect layer to form the cavity is performed using plasma; and
   the step of etching the first substrate and the MEMS device layer to form a MEMS device is performed using hydrofluoric acid vapor.

8. The method of claim 1, wherein the at least one conductive plug comprises one of tungsten (W) and copper (Cu).

9. A method for forming an integrated semiconductor device, comprising:
   providing a first wafer, the first wafer comprising a first substrate having a microelectromechanical system (MEMS) device layer, and at least one bonding pad on a surface of the MEMS device layer;
   providing a second wafer, the second wafer comprising a second substrate having at least one active device, at least one interconnect layer over the second substrate and having at least one conductive pad thereon, wherein the at least one interconnect layer in the second wafer comprises an interlayer dielectric (ILD) and at least one conductive structure embedded inside the ILD, and the at least one conductive structure is connected with the at least one conductive pad;

bonding the first wafer over the second wafer so that the MEMS device layer is connected with the at least one interconnect layer, the at least one conductive pad on the second wafer is bonded with the at least one bonding pad on the surface of the MEMS device layer, and the at least one conductive structure embedded inside the ILD is connected with the at least one bonding pad on the surface of the MEMS device layer;

etching the second substrate and the at least one interconnect layer to form a cavity extending from a surface of the second substrate to the MEMS device layer; and etching the first substrate and the MEMS device layer to form a MEMS device interfacing with the cavity extending from a surface of the second substrate to the MEMS device layer.

10. The method of claim 9, wherein the second substrate is a complementary metal-oxide-semiconductor (CMOS) substrate comprising at least one CMOS device; and bonding the first wafer over the second wafer is performed through eutectic bonding between the at least one bonding pad on the surface of the MEMS device layer and the at least one conductive pad on the at least one interconnect layer.

11. The method of claim 10, wherein the eutectic bonding is performed through eutectic reaction between one material pair selected from the group consisting of Al—Ge, Au—Au, Al—Al and Al—Au.

12. The method of claim 9, further comprising:

forming a top metal layer over the first substrate, after bonding the first wafer over the second wafer; and forming an etch stop layer (ESL) along a side wall of the cavity, after etching the second substrate and the at least one interconnect layer to form the cavity extending from a surface of the second substrate to the MEMS device layer.

13. The method of claim 9, further comprising:

forming a plurality of openings through the first substrate; and filling a protective material inside the plurality of openings and over the first substrate to form a protective layer before the step of etching the second substrate and the at least one interconnect layer to form the cavity extending from a surface of the second substrate to the MEMS device layer.

14. The method of claim 9, wherein the step of etching the second substrate and the interconnect layer to form the cavity is performed using plasma; and the step of etching the first substrate and the MEMS device layer to form a MEMS device interfacing with the cavity extending from a surface of the second substrate is performed using hydrofluoric acid vapor.

15. The method of claim 9, wherein the at least one bonding pad comprises any one of Ge, AlCu, Al and Au.

16. The method of claim 9, wherein the at least one conductive pad comprises one of AlCu, Ge, Al and Au.

* * * * *